United States Patent
Okayama

(10) Patent No.: US 7,680,361 B2
(45) Date of Patent: Mar. 16, 2010

(54) OPTICAL BUFFER DEVICE

(75) Inventor: Hideaki Okayama, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 12/289,866

(22) Filed: Nov. 6, 2008

(65) Prior Publication Data

US 2009/0214218 A1 Aug. 27, 2009

(30) Foreign Application Priority Data

Feb. 22, 2008 (JP) ............................. 2008-041708

(51) Int. Cl.
- G02F 1/295 (2006.01)
- G02F 1/01 (2006.01)
- G02B 6/12 (2006.01)
- G02B 6/26 (2006.01)
- G02B 6/42 (2006.01)
- G02B 6/00 (2006.01)
- G11C 13/04 (2006.01)
- G11C 7/00 (2006.01)
- G01J 1/04 (2006.01)
- G01J 1/42 (2006.01)
- G01J 5/08 (2006.01)

(52) U.S. Cl. ..................... 385/5; 385/14; 385/122; 385/4; 385/1; 385/16; 365/215; 250/227.12

(58) Field of Classification Search .............. 385/1, 385/4, 5, 9, 14, 16, 27, 122; 250/227.12; 365/215

See application file for complete search history.

(56) References Cited

U.S. PATENT DOCUMENTS 5,493,434 A * 2/1996 Sasayama et al. ............. 398/75

6,819,817 B2 * 11/2004 Kaneko et al. ................. 385/16

(Continued)

FOREIGN PATENT DOCUMENTS

JP A 2006-234964 9/2006

(Continued)

OTHER PUBLICATIONS

"Optical ring-resonator random-access memories," by Tucker et al, IEEE Journal of Lightwave Technology, vol. 26, No. 3, Feb. 2008, pp. 320-328.*

(Continued)

Primary Examiner—Frank G Font
Assistant Examiner—Robert Tavlykaev
(74) Attorney, Agent, or Firm—Solaris Intellectual Property Group, PLLC

(57) ABSTRACT

An optical buffer device includes plural optical memory elements that are capable of holding light and an optical delay element. The plural optical memory elements are arranged on an optical path through which signal light and control light propagate in mutually opposite directions. Further, the optical delay element is disposed between the optical memory elements that are adjacent to each other. The optical delay element imparts different delays to the signal light and the control light. According to a preferred exemplary embodiment of this optical buffer device, each of the optical memory elements includes an optical waveguide through which the signal light and the control light propagate and an optical resonator that is disposed in proximity to this optical waveguide, and a coupling between the optical waveguide and the optical resonator is generated or cancelled depending on whether or not the control light is inputted.

9 Claims, 8 Drawing Sheets

U.S. PATENT DOCUMENTS 7,245,801 B2 * 7/2007 Boyd et al. .................. 385/27
2005/0053375 A1 * 3/2005 Yoo et al. .................... 398/53

OTHER PUBLICATIONS

"All-optical logic based on silicon micro-ring resonators," by Xu et al, Optics Express, vol. 15, No. 3, Feb. 2007, pp. 924-929.*

"Optical buffers based on slow light in electromagnetically induced transparent media and coupled resonator structures: comparative analysis," by Khurgin, Journal of Optical Society of America B, vol. 22, No. 5, May 2005, pp. 1062-1074.*

"All-optical switching on a silicon chip," by Almeida et al, Optics Letters, vol. 29, No. 24, Dec. 2004, pp. 2867-2869.*

"Ultracompact optical buffers on a silicon chip," by Xia et al, Nature, vol. 1, Jan. 2007, pp. 65-71.*

M. F. Yanik et al., "Stopping Light in a Waveguide with an All-Optical Analog of Electromagnetically Induced Transparency", Phys. Rev. Lett. vol. 93, (2004) 233903.

M. Fleischhauer and M. D. Lukin, "Dark-State Polaritons in Electromagnetically Induced Transparency". Phys. Rev. Lett. vol. 84 (2000) pp. 5094-5097.

Shousaku Kudo et al., "Low-group-velocity and low-dispersion slow light in photonic crystal waveguides", Optics Letters, vol. 32, No. 20, Oct. 15, 2007, pp. 2981-2983.

* cited by examiner

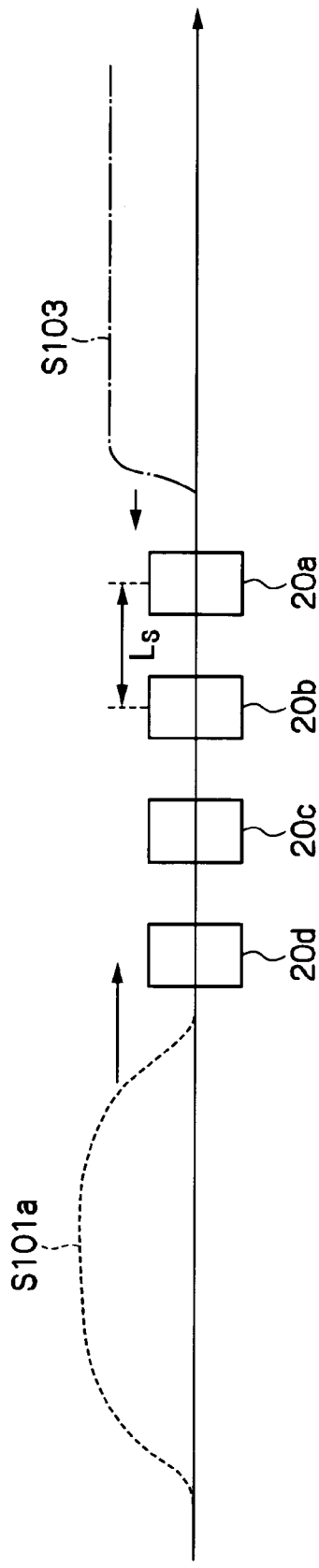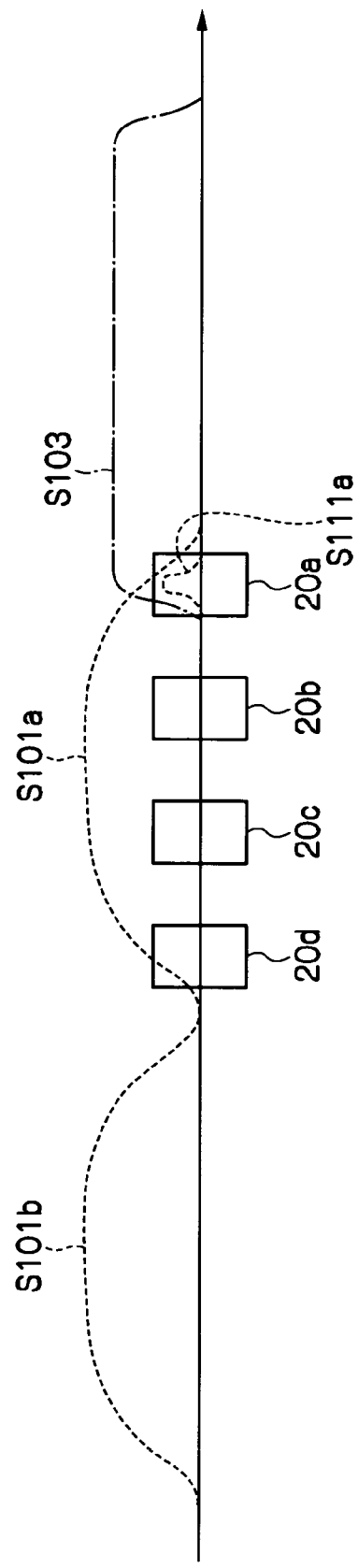

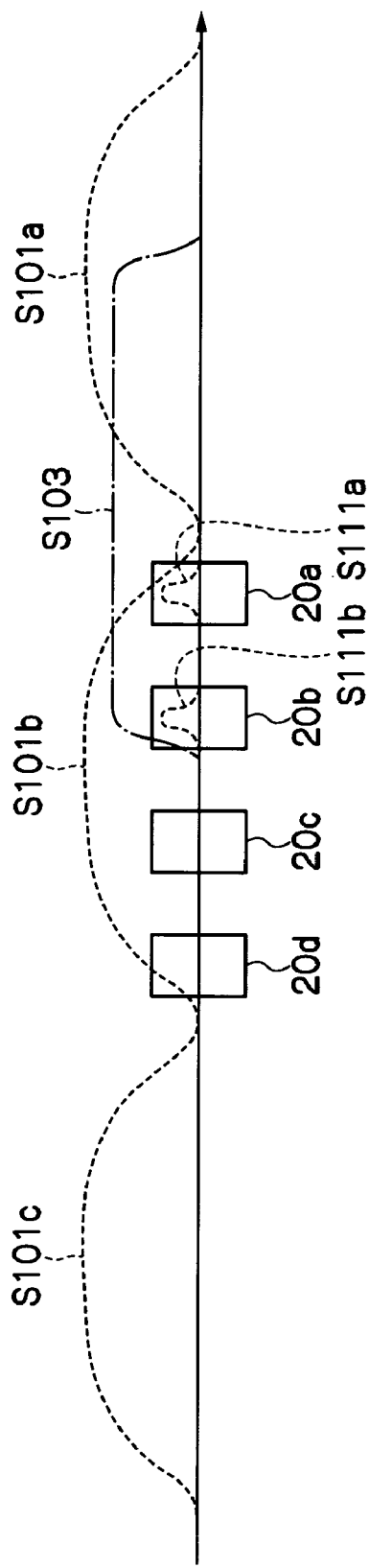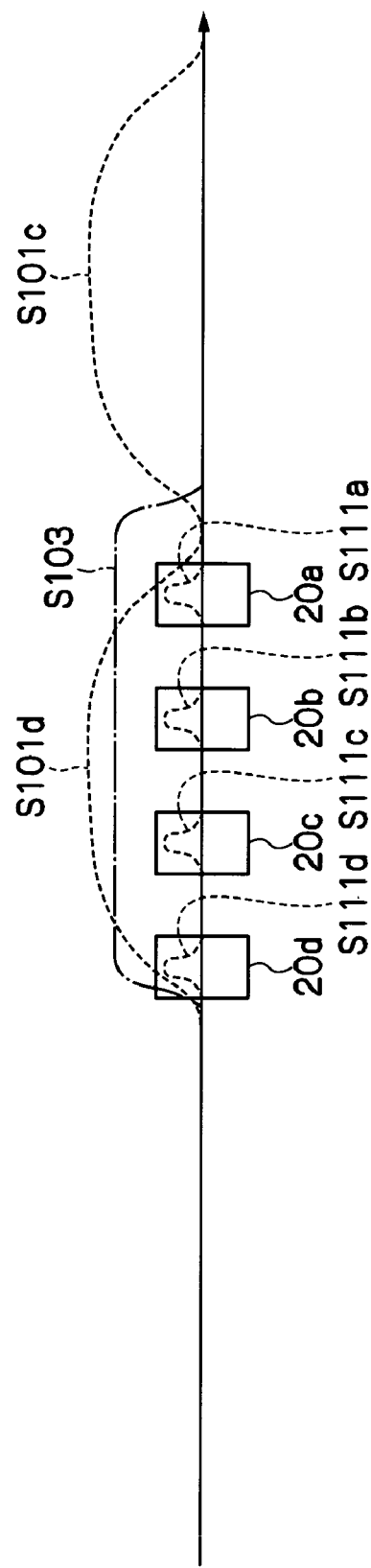

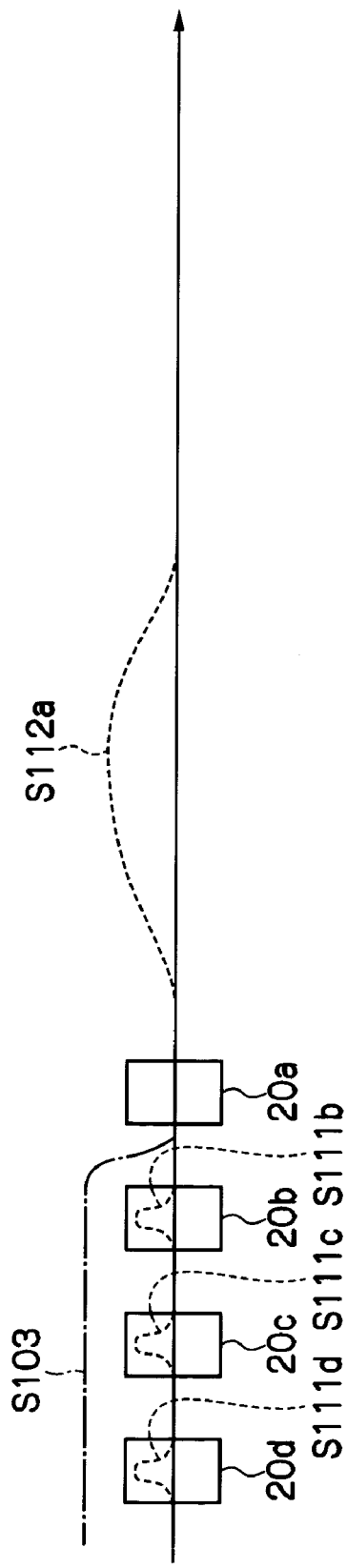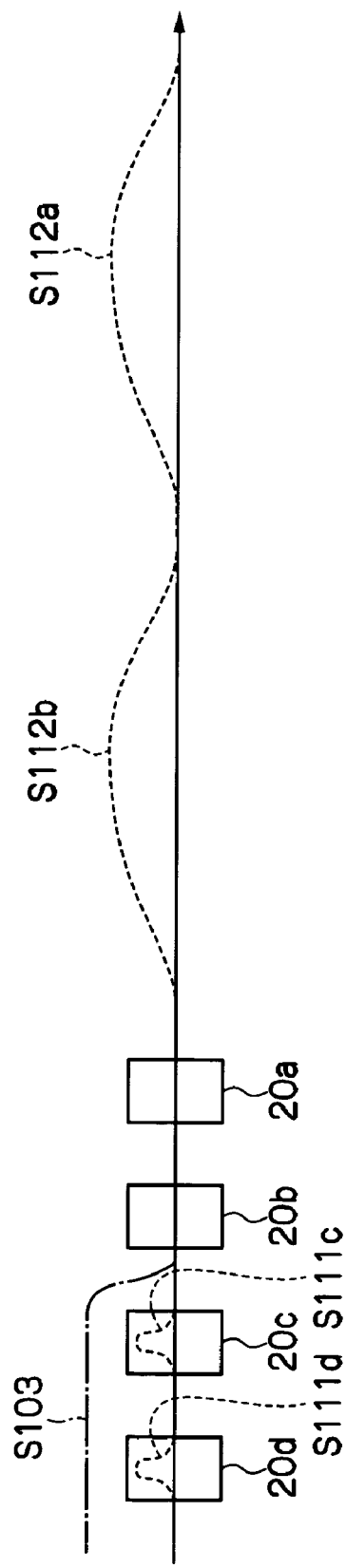

OPTICAL BUFFER DEVICE

CROSS-REFERENCE TO RELATED APPLICATION

This application claims priority under 35 USC 119 from Japanese Patent Application No. 2008-041708, the disclosure of which is incorporated by reference herein.

BACKGROUND OF THE INVENTION

1. Field of the Invention

This invention relates to an optical buffer device that is capable of holding signal light.

2. Description of the Related Art

Each node that configures an optical communication system network includes a router that performs line switching for transmitting signal light with respect to an intended node.

At present, each node that is used in an optical communication system network converts an optical signal that has been-received into an electrical signal once and performs processing that is necessary for line switching. Thereafter, each node converts the electrical signal into an optical signal and transmits that optical signal to another node.

Research on so-called optical routers that perform this line switching processing in the state of the optical signal without converting the optical signal into an electrical signal has heretofore been conducted. In technologies that are used in optical routers, an optical switch that spatially switches the traveling direction of light is relatively easily realizable. In contrast, other than an optical fiber that simply delays light, a good optical fiber that holds signal light is not known. For example, an optical bistable element is usable as an optical buffer device, but an optical bistable element cannot store anything other than intensity of the physical information that light holds.

Recently, as a technology that is applicable to an optical buffer device, a technology that stops light by controlling the group velocity of light is gathering attention. In this control of the group velocity of light, control that uses photonic crystal and a resonator (e.g., see Japanese Patent Application Publication (JP-A) No. 2006-234964 and Document 1 listed below) and control that uses an electromagnetically induced transparency (EIT) material that utilizes atomic level (e.g., see Document 2 listed below) are known.

Document 1: M. F. Yanik et al., "Stopping Light in a Waveguide with an All-Optical Analog of Electromagnetically Induced Transparency", Phys. Rev. Lett. Vol. 93, (2004) 233903

Document 2: "Dark-State Polaritons in Electromagnetically Induced Transparency" (M. Fleischhauer and M. D. Lukin, Phys. Rev. Lett. Vol. 84 (2000) pp 5094-5097)

However, in regard to the aforementioned technology that stops light by controlling the group velocity of light, heretofore there has mainly been theoretical research. Consequently, virtually no proposals have been made in regard to a specific configuration that uses this technology in optical communication.

SUMMARY OF THE INVENTION

This invention has been made in view of the aforementioned problem, and it is an object of this invention to provide an optical buffer device that includes plural optical memory elements and can write in or read from the optical memory elements optical pulses of signal light per optical pulse.

In order to achieve the aforementioned object, according to one aspect of the invention, there is provided an optical buffer device that includes plural optical memory elements that are capable of holding light and an optical delay element. The plural optical memory elements are arranged on an optical path through which signal light and control light propagate in mutually opposite directions. Further, the optical delay element is disposed between the optical memory elements that are adjacent to each other. The optical delay element imparts different delays to the signal light and the control light.

Each of the optical memory elements may be configured to include an optical waveguide through which the signal light and the control light propagate and an optical resonator that is disposed in proximity to this optical waveguide. In this case, a coupling between the optical waveguide and the optical resonator is generated or cancelled depending on whether or not the control light is inputted.

Further, each of the optical memory elements may be configured using an electromagnetically induced transparency material. In this case, the electromagnetically induced transparency material becomes transparent or opaque depending on whether or not the control light is inputted.

In implementing the optical buffer device of this invention; preferably, the optical delay element is configured using photonic crystal. Further, the optical delay element may be configured to include a first wavelength filter, a second wavelength filter, and a first optical path and a second optical path whose optical path lengths are different between the first wavelength filter and the second wavelength filter, with the signal light propagating through the first optical path and the control light propagating through the second optical path.

According to the optical buffer device of this invention, the optical buffer device is configured to include the plural optical memory elements on the optical path through which the signal light and the control light propagate, and the signal light and the control light are inputted to these optical memory elements such that, with respect to one of the signal light and the control light, the other of the signal light and the control light receives a predetermined delay. When these optical memory elements are configured using an optical resonator or an electromagnetically induced transparency material, control of whether or not to hold light in the optical memory elements depending on whether or not the control light is inputted becomes possible.

As a result of this, optical pulses that the signal light includes can be written in or read from the optical memory elements per optical pulse. At this time, when n number of the optical memory elements are disposed in parallel, the n number of the optical memory elements can hold respectively different optical pulses, so the n number of the optical memory elements can hold n bits of information. Further, for example, when the optical buffer device is configured such that the optical memory elements hold the optical pulses when the control light is being inputted and such that the optical memory elements do not hold the optical pulses when the control light is not being inputted, it becomes possible to impart an arbitrary delay amount corresponding to the duration of the control light.

BRIEF DESCRIPTION OF THE DRAWINGS

A preferred exemplary embodiment of the present invention will be described in detail based on the following figures, wherein:

FIG. 5A is a schematic diagram for describing the operation of the optical buffer device;

FIG. 5B is a schematic diagram for describing the operation of the optical buffer device;

FIG. 6A is a schematic diagram for describing the operation of the optical buffer device;

FIG. 6B is a schematic diagram for describing the operation of the optical buffer device;

FIG. 7A is a schematic diagram for describing the operation of the optical buffer device;

FIG. 7B is a schematic diagram for describing the operation of the optical buffer device.

DETAILED DESCRIPTION OF THE INVENTION

Below, an exemplary embodiment of this invention will be described, but the shape, size and the arrangement relationship of each component are only generally shown to the extent that this invention can be understood. Further, below, a preferred configural example of this invention will be described, but the material and numerical condition of each component are simply preferred examples. Consequently, this invention is not limited to the exemplary embodiment below, and many changes or variations that can achieve the effects of this invention can be performed without departing from the scope of the configuration of this invention.

(Configuration of Optical Buffer Device)

Figure 1:
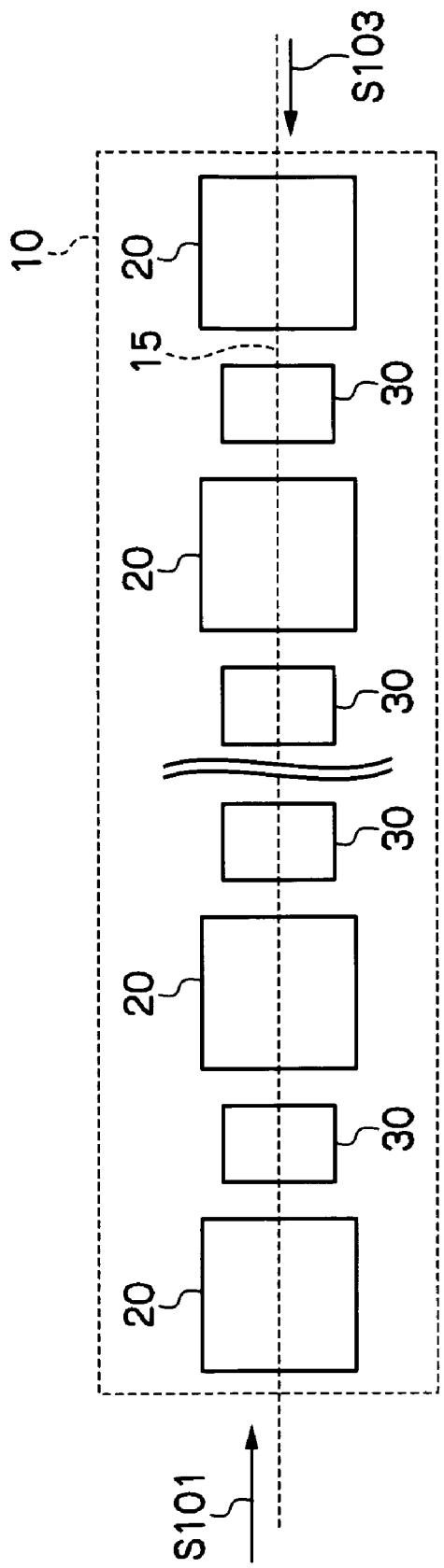
FIG. 1 is a schematic diagram of an optical buffer device of the present invention.

An optical buffer device 10 of this invention will be described with reference to FIG. 1. FIG. 1 is a schematic diagram of the optical buffer device 10 of this invention.

Signal light (indicated by arrow S101 in the drawings) is inputted to the optical buffer device 10. The optical buffer device 10 includes plural optical memory elements 20 that are arranged on an optical path 15 through which this signal light S101 propagates. The optical memory elements 20 are prepared in a number that corresponds to the number of bits required for buffering in the optical buffer device 10.

The signal light S101 that has been inputted to the optical buffer device 10 is outputted from the optical buffer device 10 via the plural optical memory elements 20 on the optical path 15. Further, control light (indicated by arrow S103 in the drawings) also propagates on this optical path 15. At this time, the control light S103 is inputted to the optical buffer device 10 from the output side of the signal light S101. In other words, the control light S103 propagates on the same optical path 15 as the signal light S101 but in the opposite direction of the signal light S101. The control light S103 is outputted, via the plural optical memory elements 20 on the optical path 15, from the side of the optical buffer device 10 to which the signal light S101 is inputted. It will be noted that the wavelength of the signal light S101 and the wavelength of the control light S103 are different.

Figure 2:
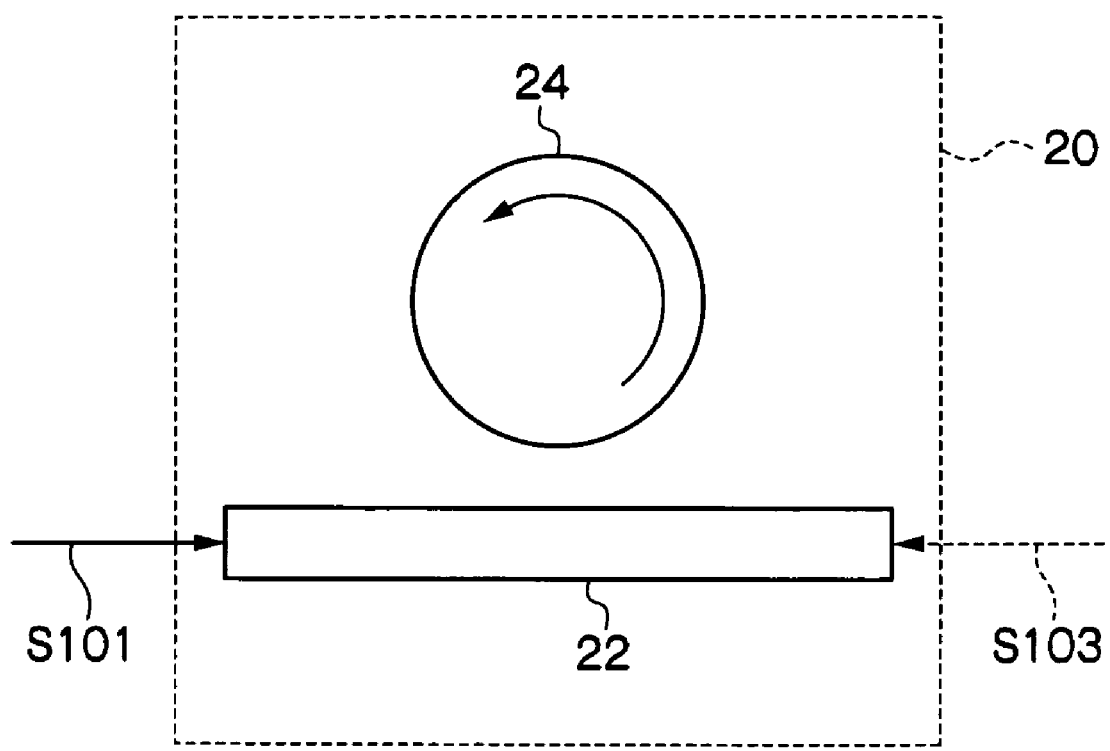
FIG. 2 is a schematic diagram of an optical memory element that uses an optical resonator.

As the optical memory elements 20, optical resonators that are the same as the prior art described in JP-A No. 2006-234964 can be used. The optical memory elements 20 will be described with reference to FIG. 2. FIG. 2 is a schematic diagram of the optical memory elements 20 that use an optical resonator.

Each of the optical memory elements 20 is configured to include, for example, an optical resonator 24 and an optical waveguide 22 that is disposed adjacent to this optical resonator 24. The optical waveguide 22 and the optical resonator 24 can be formed by a nonlinear optical material whose refractive index changes by the Kerr effect. As this nonlinear optical material, for example, there are compound semiconductors and chalcogenide glass.

Here, the optical resonator 24 is designed in a dimension and a refractive index that resonates with respect to the wavelength of the signal light S101. On the other hand, the optical resonator 24 does not resonate with respect to the wavelength of the control light S103.

In a state where only the signal light S101 is inputted and where the control light S103 is not inputted to the optical resonator 24, a coupling between the optical waveguide 22 and the optical resonator 24 is generated. For this reason, when the signal light S101 reaches the optical memory element 20, the signal light S101 passes through the optical memory element 20 while exciting the optical resonator 24.

When the control light S103 is inputted to the optical memory element 20 in a state where this signal light S101 is exciting the optical resonator 24, the refractive index of the optical waveguide 22 changes by the Kerr effect. As a result of this, the coupling between the optical waveguide 22 and the optical resonator 24 is cancelled. In this case, the coupling is cancelled in a state where the optical resonator 24 has been excited, so the signal light S101 becomes held in the optical memory element 20.

Thereafter, when the control light S103 is no longer inputted, the coupling between the optical waveguide 22 and the optical resonator 24 is again generated. As a result of this, the signal light S101 that had been held in the optical memory element 20 is outputted.

When the optical memory element 20 is configured in this manner, the signal light S101 becomes held in the optical resonator 24 while the control light S103 is being inputted, so it becomes possible to impart to the optical memory element 20 an arbitrary delay amount corresponding to the duration of the control light S103.

It will be noted that the relationship between whether or not the control light S103 is inputted and the generation and cancellation of the coupling between the optical waveguide 22 and the optical resonator 24 is not limited to the aforementioned example. That is, the optical memory element 20 may also be configured such that the coupling is generated while the control light S103 is being inputted and such that the coupling is cancelled while the control light S103 is not being inputted. When the optical memory element 20 is configured in this manner, the signal light S101 becomes held in the optical resonator 24 while the control light S103 is not being inputted.

When the optical memory element 20 is configured in this manner, in a state where the signal light S101 and the control light S103 are being inputted to the optical resonator 24, the refractive index of the optical waveguide 22 changes by the Kerr effect and the coupling between the optical waveguide 22 and the optical resonator 24 is generated. For this reason, when the signal light S101 reaches the optical memory element 20, the signal light S101 is outputted from the optical memory element 20 while exciting the optical resonator 24.

In this state, when input of the control light S103 to the optical memory element 20 stops, the change in the refractive index of the optical waveguide 22 returns to its original state by the Kerr effect. As a result of this, the coupling between the optical waveguide 22 and the optical resonator 24 is cancelled. In this case, a state where the optical resonator 24 has been excited is maintained, so the signal light S101 becomes held in the optical memory element 20.

The optical resonator 24 may also be designed in a dimension and a refractive index that resonates with respect to the wavelength of the control light S103. Thereafter, when the control light S103 is again inputted, the coupling between the optical waveguide 22 and the optical resonator 24 is generated. As a result of this, the signal light S101 that had been held in the optical memory element 20 is outputted.

Further, each of the optical memory elements 20 may be configured using an electromagnetically induced transparency (EIT) material. As the EIT material, Rb gas and alexandrite (chrysoberyl) are known. The EIT material becomes transparent with respect to the signal light S101 that is pulse light when the control light S103 that is continuous light is inputted. On the other hand, in a state where the control light S103 is not-being inputted, the EIT material becomes opaque with respect to the signal light S101. In this opaque state, the signal light S101 inside the EIT material is held as is, and the signal light S101 from the outside of the EIT material is not inputted.

Figure 3:
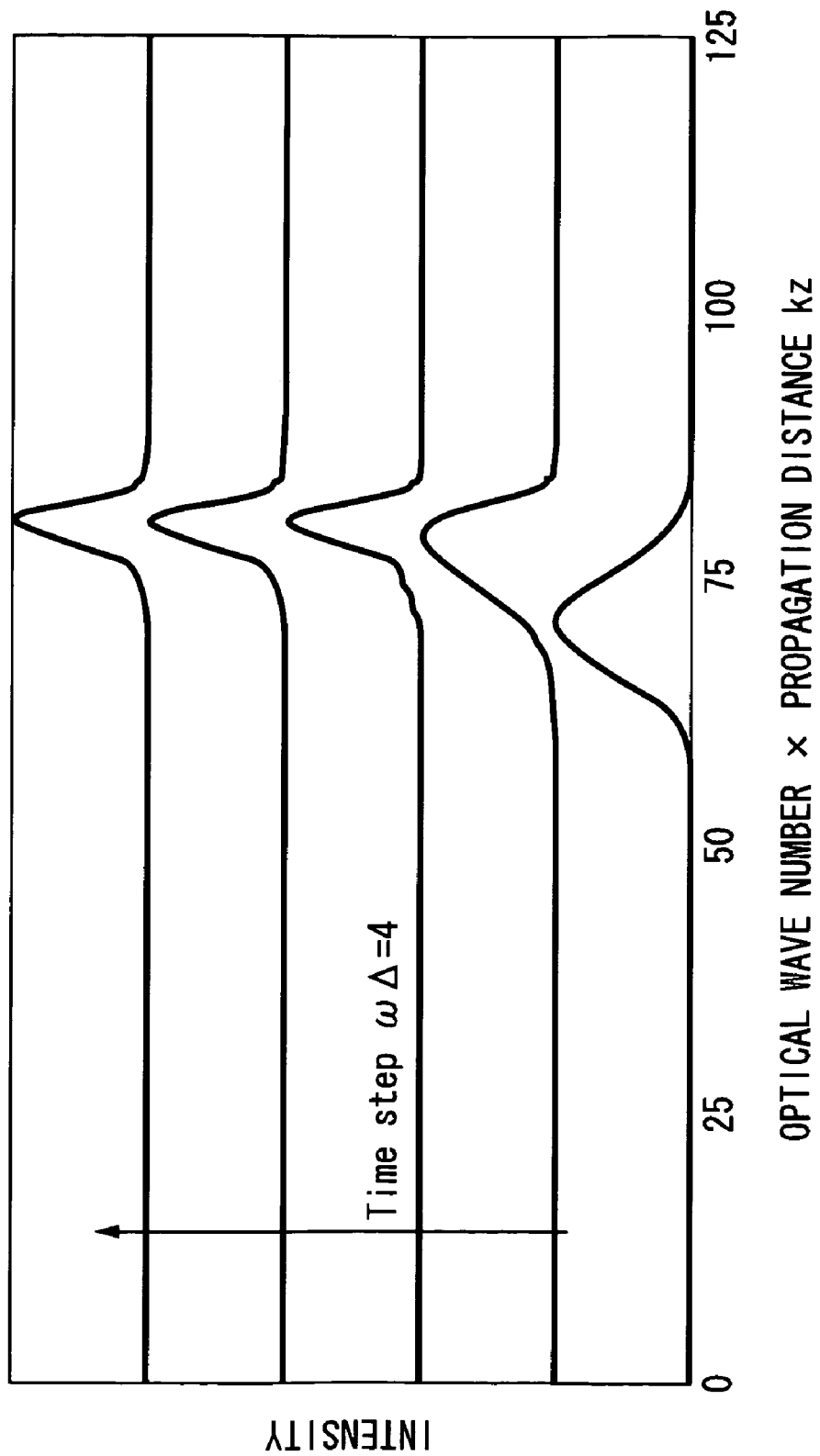
FIG. 3 is a diagram showing a simulation result of group velocity control in an EIT material.

FIG. 3 is a diagram showing a simulation result of group velocity control in the EIT material. In FIG. 3, the horizontal axis represents the product of a wave number k and a propagation distance z, and the vertical axis represents intensity.

This simulation is performed using the following expression (1) and expression (2).

$$\left\{\frac{\partial}{\partial(\omega t)} + \left(\frac{i}{1+\tan^2\theta}\right)\left[1 + \frac{\partial^2}{\partial(kz)^2}\right]\right\}\hat{E}_p = 0 \quad (1)$$

$$\tan^2\theta = \frac{\omega N d_{ba}^4}{\varepsilon_0 \hbar \Omega^2} \quad (2)$$

These expressions can be obtained from an expression representing the interaction between atomic level and light, as indicated in Document 2, for example. It will be noted that, Document 2 also included, ordinarily analysis is performed in a forwardly traveling direction.

However, in the present exemplary embodiment, the traveling directions of the signal light and the control light are opposite, so an expression is used which can perform analysis in both forwardly traveling and reflecting directions. In expression (1) and expression (2), $\omega$ represents the center frequency of light, k represents the optical wave number, z represents the propagation distance, N represents the atom density, $d_{ba}$ represents the transition dipole moment between level b and level a, $\varepsilon_0$ represents the permittivity in a vacuum, and $\Omega$ represents the intensity of the control light S103. Here, a value of $\Omega$ that establishes the condition of $\theta=\pi/2$ is used in order to stop the light.

FIG. 3 shows the result of a simulation in a state where the control light S103 and the signal light S101 have been inputted from opposite directions into the EIT material. From this result, it will be understood that the signal light S101 that has been inputted is held in a constant place (in FIG. 3, in the vicinity of kz=75). In the EIT material, the signal light S101 is stopped at the rising portion of the control light S103.

At the portion of the EIT material where the rising portion of the control light S103 has passed, it is discovered from the simulation that the signal light S101 cannot proceed into the EIT material and is reflected. Consequently, after an optical pulse of the signal light S101 is held in the EIT material, another optical pulse cannot proceed into that EIT material.

In this EIT material, the holding of light is performed using atomic level, so when an EIT material is used as the optical memory elements 20, the holding time of the light can be lengthened even more than in a case where an optical resonator is used.

The optical buffer device 10 includes optical delay elements 30 that are respectively disposed between the optical memory elements 20 that are adjacent to each other. The optical delay elements 30 impart mutually different delays to the signal light and the control light. For example, the optical delay elements 30 make the velocity of the control light S103 slow in comparison to the signal light S101.

As the optical delay elements 30, for example, a photonic crystal waveguide can be used. As indicated in "Low-group velocity and low-dispersion slow light in photonic crystal waveguides" (S. Kubo et al., Optics Letters Vol. 32 (2007) 2981), for example, the group velocity of a photonic crystal waveguide changes in accordance with the wavelength and, as a result of this, a photonic crystal waveguide can impart different delays depending on the wavelength.

A photonic crystal waveguide has excellent compactness and is suitable for a configuration where components are spatially coupled inside an optical buffer device, such as when optical memory elements are configured by an EIT material, for example.

Further, the optical delay elements 30 can also be given a configuration where each of the optical delay elements 30 includes a first optical path and a second optical path whose optical path lengths are different and imparts different delays by the difference in the optical path lengths.

Figure 4:
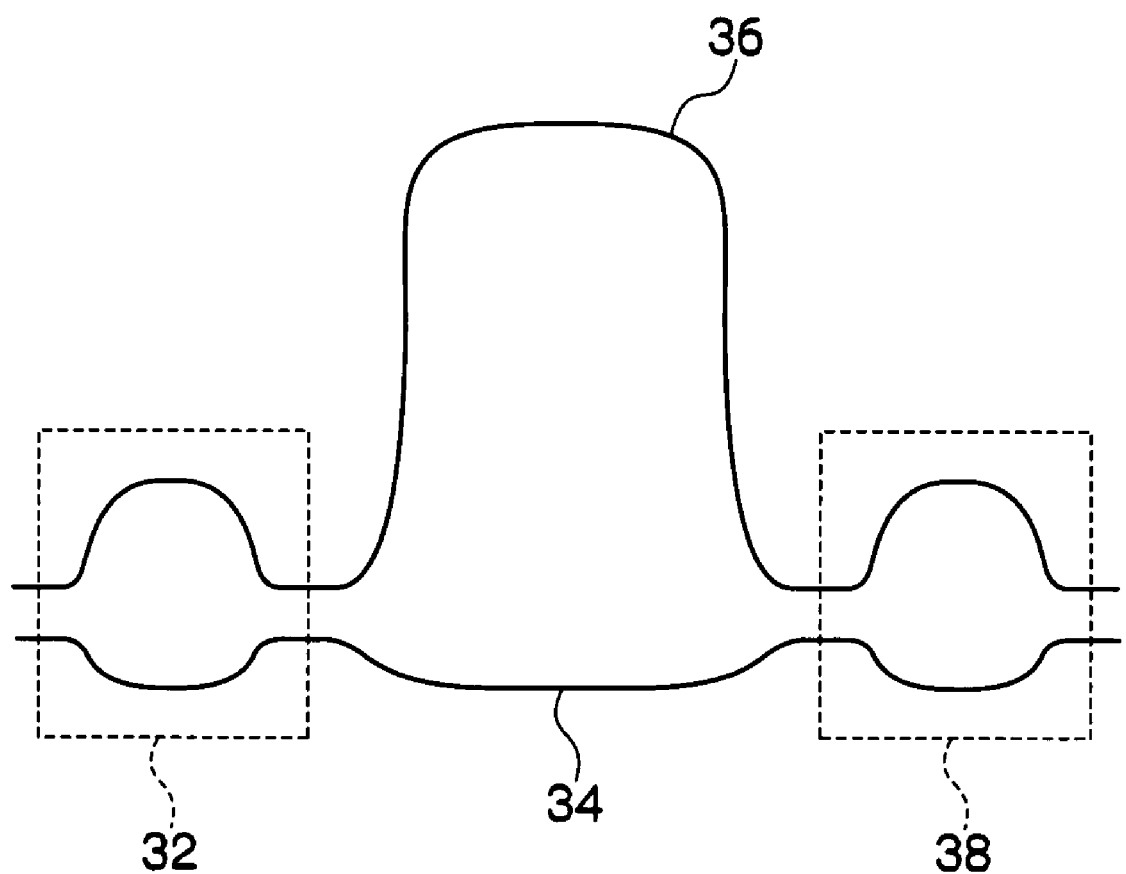
FIG. 4 is a schematic diagram for describing a configural example of an optical delay element.

A configural example of the optical delay elements 30 will be described with reference to FIG. 4. FIG. 4 is a schematic diagram for describing a configural example of the optical delay elements 30.

Each of the optical delay elements 30 can be configured to include a first wavelength filter 32, a second wavelength filter 38, and a first optical path 34 and a second optical path 36 whose optical path lengths are different between the first wavelength filter 32 and the second wavelength filter 38. Because of the first wavelength filter 32 and the second wavelength filter 38, the optical delay element 30 is, for example, designed such that the signal light S101 propagates through the first optical path 34 and such that the control light S103 propagates through the second optical path 36.

Because these optical delay elements 30 are waveguide type elements, the optical memory elements 20 and the optical delay elements 30 can also be formed on the same substrate when the optical memory elements 20 are configured using resonators as has been described with reference to FIG. 2.

(Operation of Optical Buffer Device)

The operation of the optical buffer device 10 will be described with reference to FIG. 5A to FIG. 7B. FIG. 5A to FIG. 7B are schematic diagrams for describing the operation of the optical buffer device 10.

Here, a case where the optical buffer device 10 operates as a 4-bit buffer that includes four optical memory elements 20, that is, first to fourth optical memory elements 20a to 20d, will be taken as an example and described. It will be noted that the number of the optical memory elements 20 is not limited to four and may be determined depending on the number of bits required of the optical buffer device 10. Further, in FIG. 5A to FIG. 7B, as the optical buffer device 10, the first to fourth optical memory elements 20a to 20d are shown, and illustration of other components such as the optical delay elements 30 is omitted.

The signal light S101 is configured by optical pulses. The optical pulses have a certain width spatially. For example, assuming that 1 [ps] represents a period τ of the optical pulses, each of the optical pulses has a width of about 300 [μm] in air. It will be noted that, because the refractive index is high in the elements, the pulse width becomes narrow. Here, a case where the optical buffer device 10 is configured as a 4-bit optical buffer will be taken as an example. Each of the optical pulses that the signal light S101 includes respectively represents 1 bit of information. Here, it will be assumed that 4-bit signal light S101 includes first to fourth optical pulses S101a to S101d.

Further, the control light S103 will be described as continuous light. Here, it will be assumed that the signal light S101 propagates at a normal light velocity and that the control light S103 propagates at a velocity that is slower than that of the signal light S101.

First, a case where the entire length of the optical buffer device 10 is sufficiently small in comparison to the width of the optical pulses will be taken as an example and described. Consequently, in this example, when one optical pulse is inputted to the optical buffer device 10, the optical pulse is inputted to all of the four memory elements and respectively excites the optical resonators 24.

It will be assumed that $L_s$ represents the distance between the optical memory elements 20 that are adjacent to each other and that $V_c$ represents the propagation velocity of the control light S103. In this case, the amount of time until the control light S103 that has been inputted to one of the optical memory elements 20 is inputted to the adjacent optical memory element 20 is imparted as $L_s/V_c$. Here, $V_c$ is the average velocity when the control light S103 propagates between two of the optical memory elements 20 via the intervening optical delay element 30 (illustration thereof is omitted in FIG. 5A to FIG. 7B).

It will be noted that the amount of time ($L_s/V_c$) until the control light S103 that has been inputted to one of the optical memory elements 20 is inputted to the adjacent optical memory element 20 is made equal to the period (τ) of the first to fourth optical pulses S101 of the signal light.

Here, the optical memory elements 20 are arranged, from the output side of the signal light S101 to the input side, in the order of the first optical memory element 20a, the second optical memory element 20b, the third optical memory element 20c and the fourth optical memory element 20d. Further, the first to fourth optical pulses S101a to S101d are inputted in this order to the optical buffer device 10 (FIG. 5A).

When the first optical pulse S101a reaches the optical buffer device 10, the first optical pulse S101a simultaneously excites the first to fourth optical memory elements 20a to 20d. The control light S103 reaches the first optical memory element 20a in a state where this first optical pulse S101a is exciting each of the optical memory elements 20. When the control light S103 reaches the first optical memory element 20a, the coupling between the optical resonator 24 and the optical waveguide 22 in the first optical memory element 20a is cancelled and a first optical pulse S111a is held in the first optical memory element 20a (FIG. 5B).

Following the first optical pulse S101a, the second optical pulse S101b is inputted to the optical buffer device 10. The second optical pulse S101b excites the second to fourth optical memory elements 20b to 20d. At this time, the first optical memory element 20a is not excited by the second optical pulse S101b because the coupling is cancelled by the presence of the control light S103.

The amount of time until the control light S103 that has been inputted to one of the optical memory elements 20 is inputted to the adjacent optical memory element 20 is equal to the period τ of the optical pulses of the signal light S101 ($L_s/V_c=\tau$), so the control light S103 reaches the second optical memory element 20b in a state where the second optical pulse S101b is exciting the second to fourth optical memory elements 20b to 20d. When the control light S103 reaches the second optical memory element 20d, the coupling between the optical resonator 24 and the optical waveguide 22 in the second optical memory element 20b is cancelled and the second optical pulse S101b is held in the second optical memory element 20b (FIG. 6A).

Similarly, the third optical pulse S101c is held in the third optical memory element 20c, and the fourth optical pulse S101d is held in the fourth optical memory element 20d.

As a result of this, first to fourth optical pulses S111a to S111d become respectively held in the first to fourth optical memory elements 20a to 20d (FIG. 6B).

Thereafter, when the control light S103 disappears, in each of the optical memory elements 20a to 20d, the coupling between the optical resonator 24 and the optical waveguide 22 is generated, and the optical pulses that had been held are outputted in order.

First, in the first optical memory element 20a, when the control light S103 disappears, the coupling is generated in the first optical memory element 20a and a first optical pulse S112a is outputted (FIG. 7A).

Next, when the time τ ($=L_s/V_c$) elapses, in the second optical memory element 20b, the control light S103 disappears. Then, the coupling is generated in the second optical memory element 20b and a second optical pulse S112b is outputted (FIG. 7B).

Similarly, when the control light S103 disappears in the third optical memory element 20c and the fourth optical memory element 20d, the couplings are generated in the third optical memory element 20c and the fourth optical memory element 20d and a third optical pulse and a fourth optical pulse are outputted.

The optical pulses that have been outputted from each of these optical memory elements 20 have the same period τ as the optical pulses of the signal light S101 before being inputted to the optical buffer device 10 and are outputted from the optical buffer device 10 after being delayed by an amount of time corresponding to the duration of the control light S103.

Figure 8:
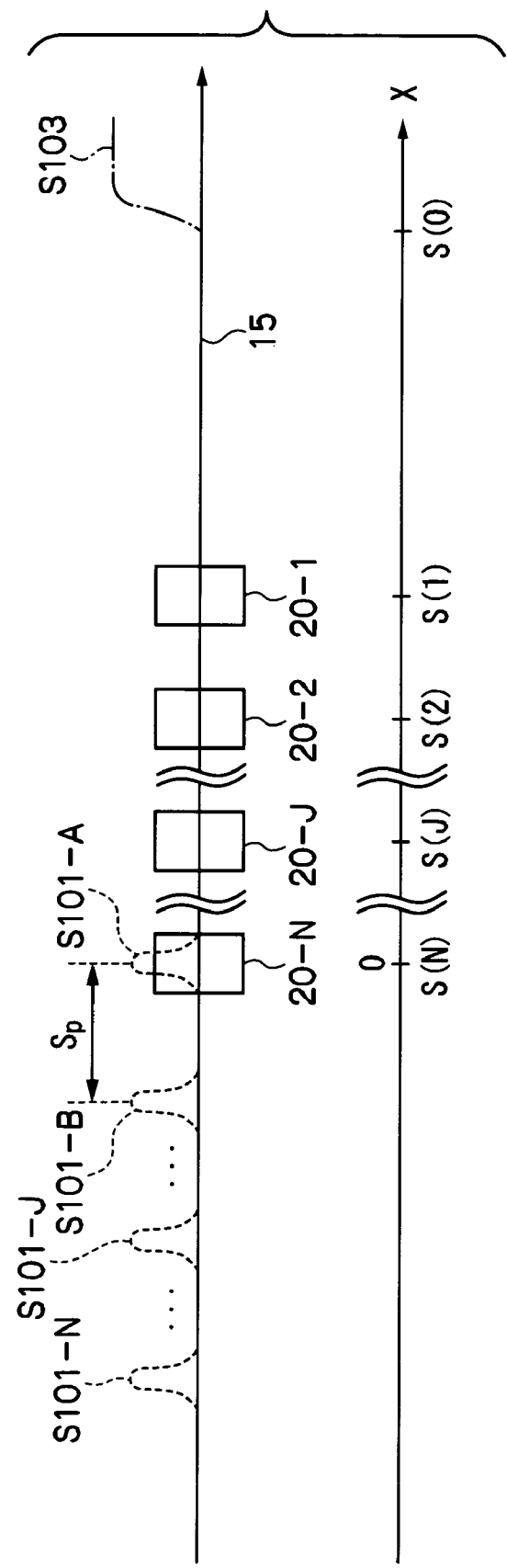
FIG. 8 is a schematic diagram for describing the operation of the optical buffer device.

Next, a case where the entire length of the optical buffer device 10 cannot be ignored in comparison to the width of the optical pulses will be taken as an example and described with reference to FIG. 8. FIG. 8 is a schematic diagram for describing the operation of the optical buffer device 10.

Here, it will be assumed that the number of the optical memory elements 20 with which the optical buffer device 10 is disposed is N and that N number of optical pulses S101-1 to S101-N that the signal light S101 includes are inputted.

In this example, each of the optical pulses sequentially propagates through the N number of the optical memory elements 20 and respectively excites their optical resonators 24. Here, it will be assumed that first to Nth optical memory elements 20-1 to 20-N are sequentially arranged from the output side of the signal light S101 to the input side. That is, the signal light S101 that has been inputted to the optical buffer device 10 passes through the Nth optical memory element 20-N, the N−1th optical memory element 20-(N−1), the second optical memory element 20-2 and the first optical memory element 20-1 in this order and is outputted from the optical buffer device 10.

An X axis is taken along the optical path 15, and the propagation direction of the signal light S101 is a positive direction. Positions on the X axis where the first to Nth optical memory elements 20 are disposed are respectively indicated by S(1) to S(N). It will be noted that the position of the Nth optical memory element 20-N is an origin of the X axis. That is, S(N)=0.

It will be assumed that, in an initial state (time τ=0), the first optical pulses S101-1 is on the origin of the X axis, and the second to Nth optical pulses S101-2 to S101-N are sequentially arranged at intervals of $S_p$ in the negative direction of the X axis. Further, it will be assumed that the head of the control light S103 is on S(0).

It will be assumed that $V_{s0}$ and $V_{c0}$ respectively represent the velocities of the signal light S101 and the control light S103 outside the optical buffer device 10. Further, it will be assumed that $V_s$ and $V_c$ respectively represent the velocities of the signal light S101 and the control light S103 inside the optical buffer device 10.

An amount of time $t_c(J)$ for the control light S103 to reach the Jth optical memory element 20-J is imparted by the following expression (3).

$$t_c(J) = \frac{S(0) - S(1)}{V_{c0}} + \frac{S(1) - S(J)}{V_c} \quad (3)$$

On the other hand, an amount of time $t_s(J)$ for the Jth optical pulse S101-J to reach the Jth optical memory element 20-J is imparted by the following expression (4).

$$t_s(J) = \frac{(J-1)S_p}{V_{s0}} + \frac{S(J) - S(N)}{V_s} \quad (4)$$

When the Jth optical pulse S101-J and the control light S103 simultaneously reach the Jth optical memory element 20-J, that is, when $t_c(J)$ and $t_s(J)$ coincide, the Jth optical pulse S101-J is held in the Jth optical memory element 20-J. Thus, when expression (3) and expression (4) are transformed using $t_c(J)=t_s(J)$, the following expression (5) is obtained. It will be noted that, here, S(N)=0.

$$S(J) \cdot \left(\frac{1}{V_s} + \frac{1}{V_c}\right) = -\frac{(J-1)S_p}{V_{s0}} + \frac{S(0)}{V_{c0}} + S(1)\left(\frac{1}{V_c} - \frac{1}{V_{c0}}\right) \quad (5)$$

Assuming that J=1 in this expression (5), the following expression (6) is obtained.

$$S(0) = V_{c0} S(1) \left(\frac{1}{V_s} + \frac{1}{V_{c0}}\right) \quad (6)$$

Consequently, the following expression (7) is obtained from expression (5) and expression (6).

$$S(J)\left(\frac{1}{V_s} + \frac{1}{V_c}\right) = \frac{-(J-1)S_p}{V_{s0}} + S(1)\left(\frac{1}{V_s} + \frac{1}{V_c}\right) \quad (7)$$

Next, in regard to expression (7), assuming that J=N, S(N)=0, so the following expression (8) is obtained.

$$\frac{(N-1)S_p}{V_{s0}} = S(1)\left(\frac{1}{V_s} + \frac{1}{V_c}\right) \quad (8)$$

Consequently, from expression (7) and expression (8), the X coordinate S(J) of the Jth optical memory element 20-J is imparted by the following expression (9).

$$S(J) = \frac{(N-J)S_p}{V_{s0}\left(\frac{1}{V_s} + \frac{1}{V_c}\right)} \quad (9)$$

From expression (9), it will be understood that it is good for the optical memory elements 20 to be arranged at the equal intervals $L_s(=S_p/V_{s0}/(1/V_s+1/V_c))$ along the optical path 15. Here, assuming that $\tau_s(=L_s/V_s)$ represents the propagation time of the signal light S101 and that $\tau_c(=L_s/V_c)$ represents the propagation time of the control light S103, expression (9) can be expressed by the following expression (10).

$$S(J) = \frac{(N-J)\tau_s V_s}{1 + \frac{\tau_c}{\tau_s}} \quad (10)$$

Unless the velocity $V_c$ of the control light S103 is sufficiently smaller than the velocity $V_s$ of the signal light S101 ($V_c \ll V_s$), then $S(J)=(N-J)\times\tau V_c$ from expression (9). Consequently, the entire length of the elements can be shortened the smaller that the velocity of the control light S103 is.

Conversely, even when the velocity $V_s$ of the signal light S101 is sufficiently smaller than the velocity $V_c$ of the control light S103 ($V_s \ll V_c$), $S(J)=(N-J)\times\tau V_s$ from expression (9), so the entire length of the elements can be shortened the smaller that the velocity of the signal light S101 is.

As for the amount of time it takes to reach the Jth optical memory element 20-J, the Jth optical pulse is $t=(J-1)\tau+(N-J)\tau_s$, and the control light S103 is $\tau=\tau_{c0}+(J-1)\tau_c$. Here, τ is the interval between the optical pulses outside the elements, $\tau_s$ is the propagation time between the optical memory elements 20 with respect to the signal light S101, and $\tau_c$ is the propagation time of the control light S103.

In regard to both expressions, when cases where J=1 and J=N are respectively calculated, then $(N-J)\tau_s=\tau_{c0}$ and $\tau=\tau_{c0}+\tau_c$ are obtained. A case where the entire length of the elements can be ignored with respect to the signal light S101 can be approximated as $\tau_s=0$, so in this case, $\tau=t_c$ is approximately established.

During reading, the signal light pulses are generated at an interval of $\tau_c$, so when the original pulse interval τ is generated inside the elements, it is necessary to bring them both as close to each other as possible. The time when reproduced signals are outputted at the element terminal ends is when the time t is imparted by the following expression (11).

$$\begin{aligned} t &= (J-1)\tau_c + (J-1)\tau_s + t_0 \\ &= (J-1)(\tau_c + \tau_s) + t_0 \\ &= (J-1)\tau + t_0 \end{aligned} \quad (11)$$

Consequently, at the element terminal ends, optical signals can be reproduced at the original pulse interval τ.

As mentioned above, according to the optical buffer device of this invention, the optical buffer device is configured to include the plural optical memory elements on the optical path through which the signal light and the control light propagate, and the signal light and the control light are inputted to these optical memory elements from opposite directions. When an optical resonator or an electromagnetically induced transparency material is used as these optical memory elements, control of whether or not to hold light in the optical memory elements depending on whether or not the control light is inputted becomes possible.

As a result of this, optical pulses of the signal light can be written in or read from the optical memory elements per optical pulse. At this time, when n number of the optical memory elements are disposed in parallel, the n number of the optical memory elements can hold respectively different optical pulses, so the n number of the optical memory elements can hold n bits of information. Further, for example, when the optical buffer device is configured such that the optical memory elements hold the optical pulses when the control light is being inputted and such that the optical memory elements do not hold the optical pulses when the control light is not being inputted, it becomes possible to impart an arbitrary delay amount corresponding to the duration of the control light.

What is claimed is:

1. An optical buffer device comprising:
   a plurality of optical memory elements that are arranged along an optical path through which signal light and control light propagate in mutually opposite directions, with the optical memory elements configured to hold light; and
   a plurality of optical delay elements each disposed between a pair of adjacent optical memory elements and imparting different delays to the signal light and the control light,
   wherein the control light is not divided as the control light propagates through the optical path.

2. The optical buffer device of claim 1, wherein
   each of the optical memory elements includes an optical waveguide through which the signal light and the control light propagate and an optical resonator that is disposed in proximity to the optical waveguide, and
   a coupling between the optical waveguide and the optical resonator is generated or cancelled depending on whether or not the control light is applied to the respective optical memory element.

3. The optical buffer device of claim 1, wherein
   each of the optical memory elements is configured using an electromagnetically induced transparency material, and
   the electromagnetically induced transparency material becomes transparent or opaque depending on whether or not the control light is applied to the respective optical memory element.

4. The optical buffer device of claim 1, wherein each optical delay element is configured using a photonic crystal in which a group velocity of the signal light propagating through the optical delay element is different from a group velocity of the control light propagating through the optical delay element.

5. The optical buffer device of claim 2, wherein each optical delay element is configured using a photonic crystal in which a group velocity of the signal light propagating through the optical delay element is different from a group velocity of the control light propagating through the optical delay element.

6. The optical buffer device of claim 3, wherein each optical delay element is configured using a photonic crystal in which a group velocity of the signal light propagating through the optical delay element is different from a group velocity of the control light propagating through the optical delay element.

7. An optical buffer device comprising:
   a plurality of optical memory elements that are arranged along an optical path through which signal light and control light propagate in mutually opposite directions, with the optical memory elements configured to hold light; and
   a plurality of optical delay elements each disposed between a pair of adjacent optical memory elements and imparting different delays to the signal light and the control light,
   wherein the control light is not divided as the control light propagates through the optical path,
   each optical delay element includes a first wavelength filter, a second wavelength filter, and a first optical path and a second optical path whose optical path lengths are different between the first wavelength filter and the second wavelength filter, and
   the signal light propagates through the first optical path, and
   the control light propagates through the second optical path.

8. The optical buffer device of claim 7, wherein
   each of the optical memory elements includes an optical waveguide through which the signal light and the control light propagate and an optical resonator that is disposed in proximity to the optical waveguide, and a coupling between the optical waveguide and the optical resonator is generated or cancelled depending on whether or not the control light is applied to the respective optical memory element.

9. The optical buffer device of claim 8, wherein
   each of the optical memory elements is configured using an electromagnetically induced transparency material, and the electromagnetically induced transparency material becomes transparent or opaque depending on whether or not the control light is applied to the respective optical memory element.

* * * * *